United States Patent [19]

Hashimoto et al.

[11] Patent Number: 5,093,807
[45] Date of Patent: Mar. 3, 1992

[54] VIDEO FRAME STORAGE SYSTEM

[75] Inventors: Masashi Hashimoto, Garland; Gene A. Frantz, Missouri City, both of Tex.; John V. Moravec, Willow Springs, Ill.; Jean P. Dolait, Villeneuve-Loubet, France

[73] Assignee: Texas Instruments Incorporated, Dallas, Tex.

[21] Appl. No.: 512,611

[22] Filed: Apr. 20, 1990

Related U.S. Application Data

[63] Continuation of Ser. No. 137,305, Dec. 23, 1987, abandoned.

[51] Int. Cl.$^5$ .............................................. G11C 8/00
[52] U.S. Cl. ........................... 365/230.09; 365/230.08; 365/236
[58] Field of Search ............ 365/230.01, 233, 239, 365/240, 230.02, 230.03, 230.04, 230.08, 230.09, 236

[56] References Cited

U.S. PATENT DOCUMENTS

| | | | |
|---|---|---|---|
| 3,895,360 | 7/1975 | Cricchi et al. | 365/230 X |
| 3,962,689 | 6/1976 | Brunson | 365/239 |
| 4,120,048 | 10/1978 | Fuhrman | 365/239 |
| 4,581,721 | 4/1986 | Gunawardana | 365/239 X |
| 4,608,678 | 8/1986 | Threewitt | 365/230 X |
| 4,633,441 | 12/1986 | Ishimoto | 365/230 X |

OTHER PUBLICATIONS

IEEE Transactions on Computers, vol. C-28, No. 3, Mar. 1979, Processes for Random and Sequential Accessing in Dynamic Memories, Morris et al.
Proc. of IEEE Custom Integrated Circuits Conference, May 4-7, 1987, pp. 315-318.
Wada et al., "A Color Television Receiver with Digital Frame Memory", pp. 128-129, *IEEE International Conference on Consumer Electronics*, 86CH2319/2/86/0000-0128, Tham 9.2, 1986 IEEE.
Hashimoto et al., "A 20 ns 256K×4 FIFO Memory", *Proceedings of the IEEE Integrated Circuits Conference*, CH2430-7/87/0000-0315, 1987 IEEE, pp. 316-318.
Nakagawa et al., "A 1 Mb Field Memory for TV Pictures", *IEEE 1987 Custom Integrated Circuits Conference*, CH2430-7/87/0000-0319, pp. 319-322.
Kazuhiro et al., "A Field Store System with Single 1 Mbit Field Memory", pp. 70-71, *ICCE Digest of Technical Papers*, Jun. 8-10, 1988, IEEE Book No. 88CH2564-3.
Hashimoto et al., "A 20-ns 256K×4 FIFO Memory", *IEEE Journal of Solid-State Circuits*, vol. 23, No. 2, Apr. 1988, pp. 490-499.
Miyaguchi et al., "A Field Store System with Single 1 Mbit Field Memory", *IEEE Transactions on Consumer Electronics*, vol. 34, No. 3, Aug. 1988, pp. 397-401.

*Primary Examiner*—Andrew L. Sniezek
*Attorney, Agent, or Firm*—Richard B. Havill; Lawrence J. Bassuk; Richard L. Donaldson

[57] ABSTRACT

A memory circuit (14) having features specifically adapted to permit the memory circuit (14) to serve as a video frame memory. The memory circuit (14) contains a dynamic random access memory array (24) with buffers (18, 20) on input and output data ports (22) thereof to permit asynchronious read, write and refresh accesses to the memory array (24). The memory circuit (14) is accessed both serially and randomly. An address generator (28) contains an address buffer register (36) which stores a random access address and an address sequencer (40) which provides a stream of addresses to the memory array (24). An initial address for the stream of addresses is the random access address stored in the address buffer register (36).

8 Claims, 3 Drawing Sheets

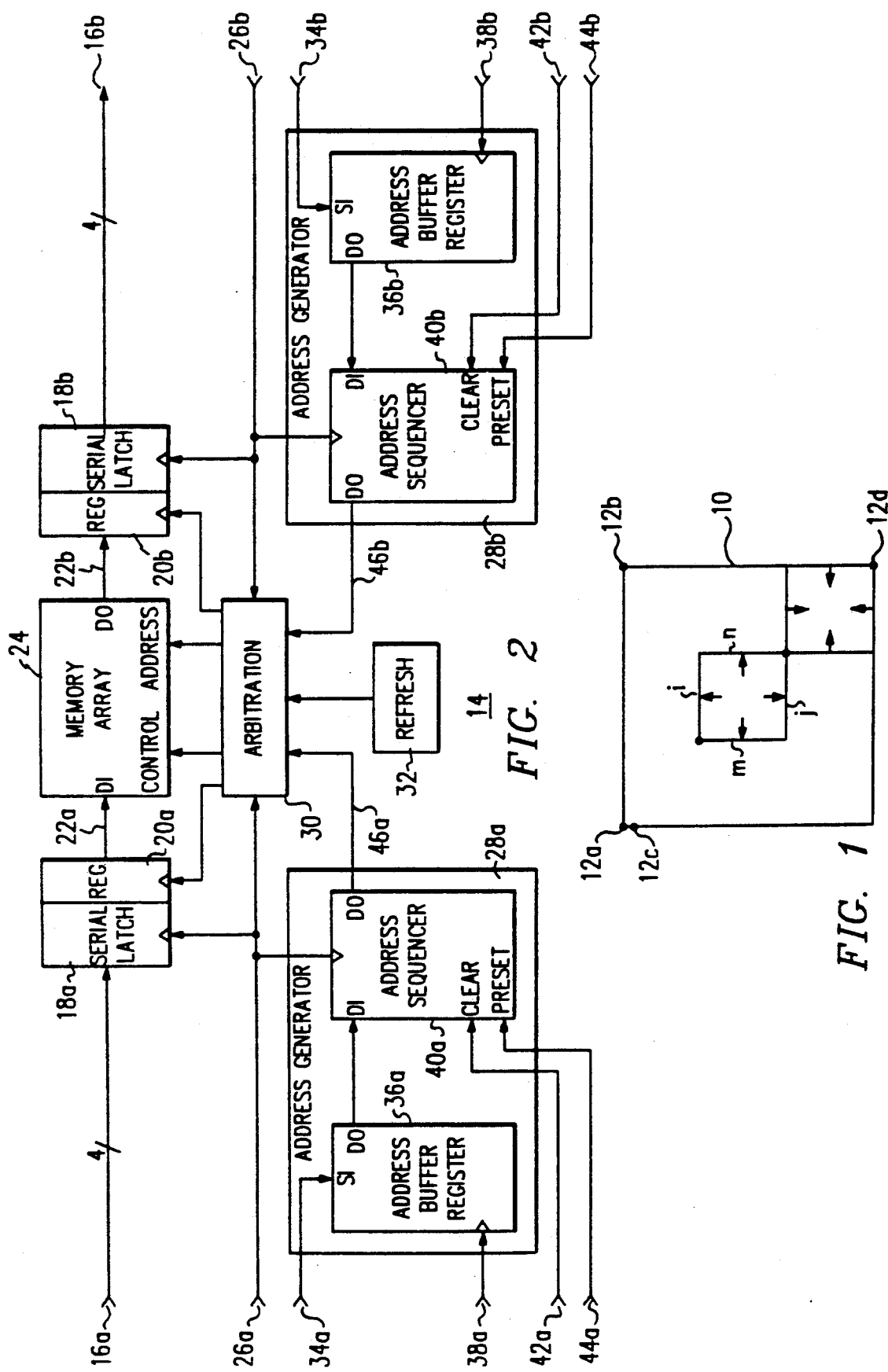

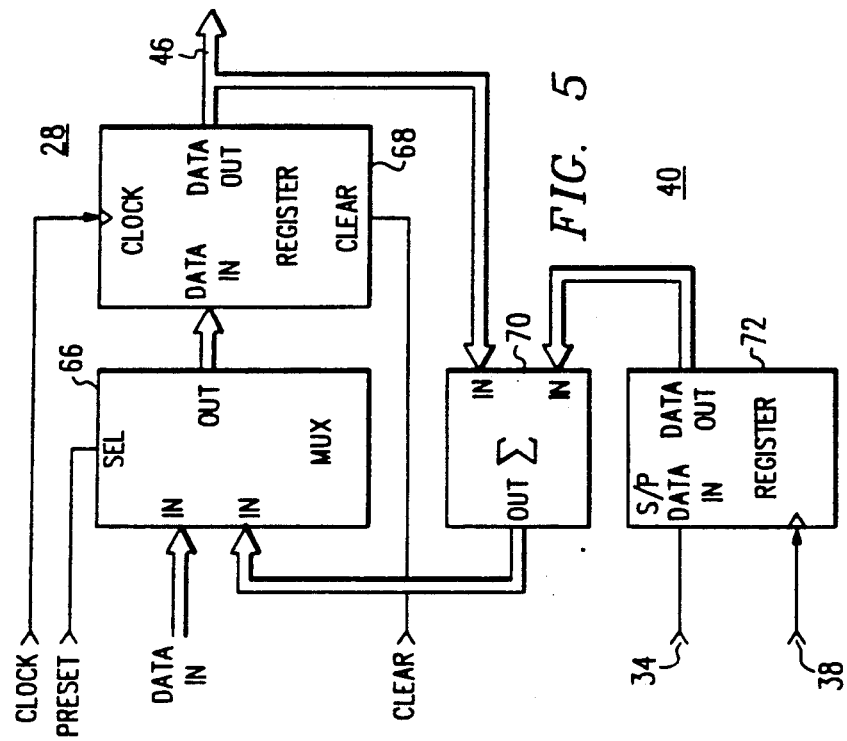
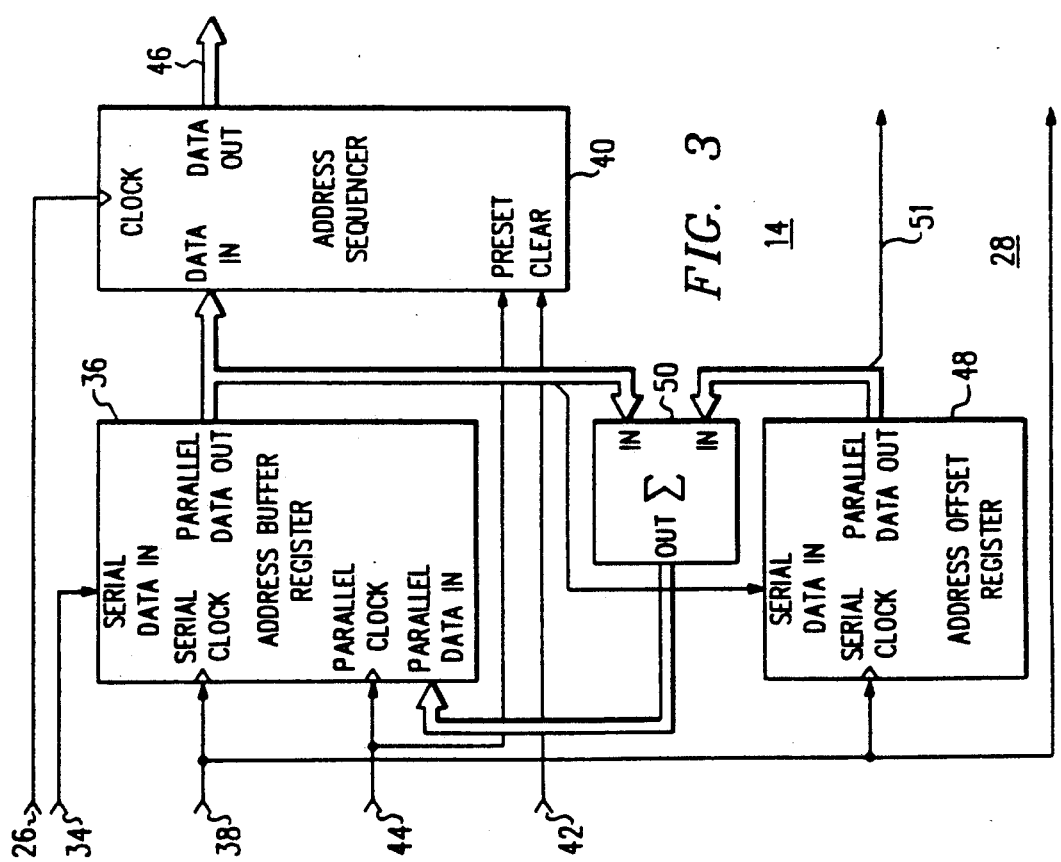

VIDEO FRAME STORAGE SYSTEM

This application is a continuation of Ser. No. 137,305, filed Dec. 23, 1987, now abandoned.

TECHNICAL FIELD OF THE INVENTION

The present invention relates in general to digital memory circuits. Specifically, the present invention relates to digital memory circuits which have particular advantages when used in connection with video applications.

BACKGROUND OF THE INVENTION

Digital TV, VCR, and related video applications often utilize a frame or field memory that stores pixels which together represent an entire frame of video. Such a frame memory is used in producing a variety of special effects, such as frame freezing, zoom, pan, split screen monitoring, and the like. Although a frame memory may be constructed using conventional discrete integrated circuits, such a frame memory is relatively expensive, dissipates an undesirably large amount of power, and occupies an undesirably large amount of space. When such a frame memory is targeted for use in a commercial product, these problems are major ones. Accordingly, a single integrated circuit, either alone or in combination with as few other integrated circuits as possible, improves upon a frame memory which has been constructed from conventional discrete integrated circuits.

Prior art integrated circuit devices have attempted to address the frame memory problem. However, such devices fail to provide an architecture which adequately addresses video application needs. For example, devices which include only a few of the typically needed frame memory functions may be used in providing a wide variety of special effects. However, they must be combined with such a large quantity of conventional discrete integrated circuits that little improvement results over constructing a frame memory entirely from conventional discrete integrated circuits. On the other hand, a conventional frame memory integrated circuit may include a random access memory with complete on-chip address calculation. A video application which utilizes such a frame memory accesses the entire frame memory serially. Thus, frame freeze and split screen monitoring special effects are supported. However, zoom and pan functions are either impossible or impractical using such a device.

Accordingly, the industry feels a need for a frame memory integrated circuit which optimizes circuit architecture to accommodate a wide variety of special effects without requiring a large quantity of surrounding integrated circuits.

SUMMARY OF THE INVENTION

Accordingly, it is an advantage of the present invention that a frame memory circuit is provided which permits limited random access. Consequently, a device constructed according to the teachings of the present invention may be efficiently used to perform a wide variety of special effect video applications.

Another advantage of the present invention is that a memory circuit is provided which includes a variety of address calculation modes. Thus, a portion of the address calculations for certain special effect functions may be transferred to the memory circuit, and a video application which utilizes such a memory circuit need not allocate processing power to such calculations. An input buffer arrangement generates a sequence of write memory addresses and asynchronously transfers data from the data input to the random access memory. An output buffer arrangement generates read memory addresses and asynchronously transfers data from the random access memory to the data output. An arbitration circuit is responsive to signals from both the input buffer and the output buffer for coordinating simultaneous transfers of the sequence of write memory addresses and corresponding input data to the random access memory and for coordinating simultaneous transfers of the read memory addresses to the random access memory and corresponding output data from the random access memory to the output buffer.

BRIEF DESCRIPTION OF THE DRAWINGS

A more complete understanding of the present invention may be derived by referring to the detailed description and claims when considered in connection with the accompanying drawings, in which like reference numbers indicate like features throughout the drawings, and wherein:

FIG. 1 illustrates a frame of a video display screen with which the present invention may be used;

FIG. 2 shows a block diagram of a memory circuit built according to the teachings of the present invention;

FIG. 3 shows a block diagram of a first alternate embodiment of an address generator portion of a memory circuit built according to the teachings of the present invention;

FIG. 5 shows a block diagram of an address sequencer utilized by the address generator portion of a memory circuit built according to the teachings of the present invention.

DETAILED DESCRIPTION

Figure 4:
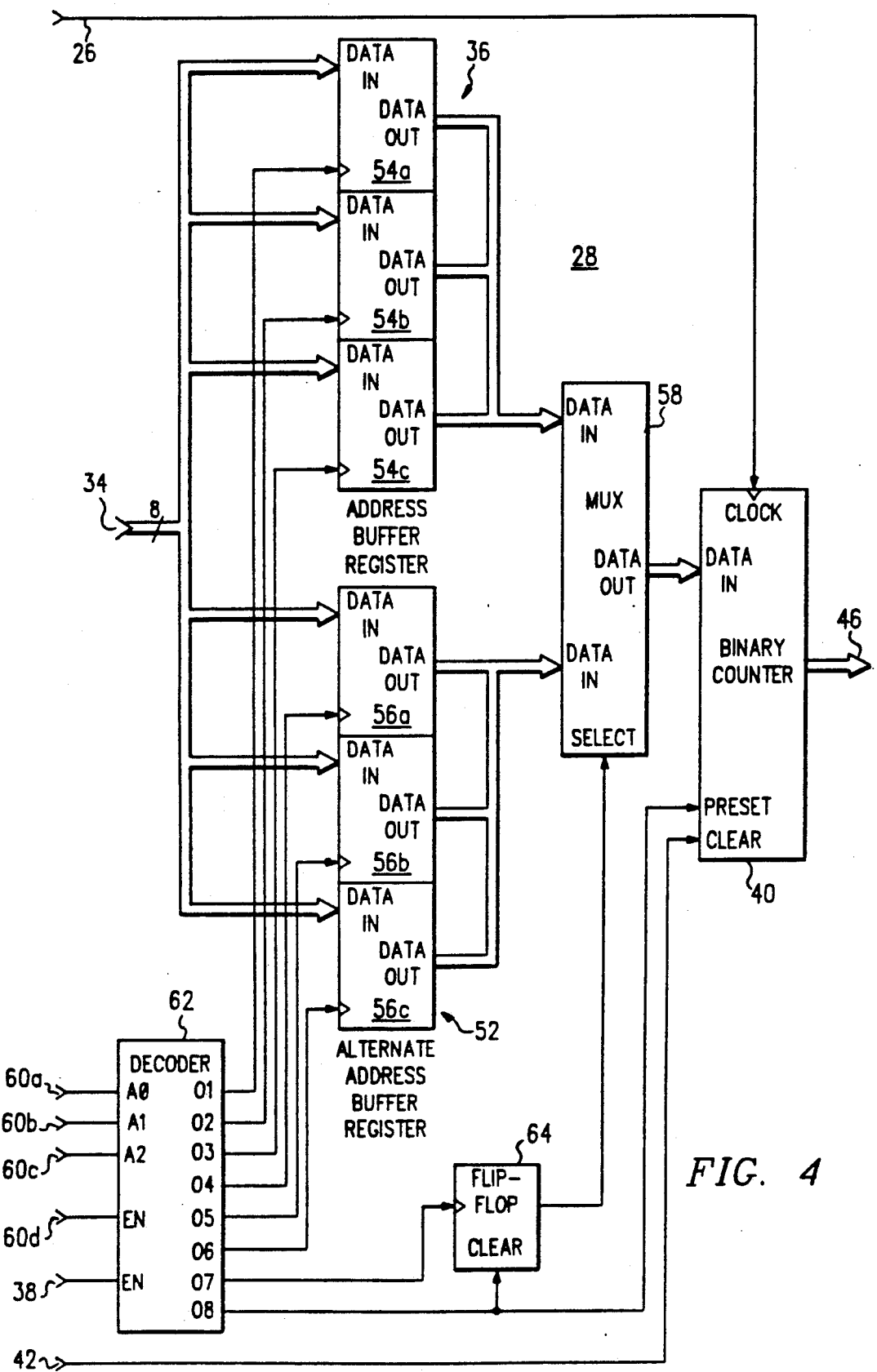
FIG. 4 shows a block diagram of a second alternate embodiment of an address generator portion of a memory circuit built according to the teachings of the present invention.

FIG. 1 illustrates a video frame 10, such as may appear on a TV tube or other video display terminal. Although frame 10 may appear as a continuous analog video picture to a viewer, frame 10 may be electrically represented as a multiplicity of digitized pixels 12. The continuous analog signal is converted to digital signals by an analog-to-digital converter, as described in Transmission Systems for Communications, Fifth Edition, Bell Telephone Laboratories, pages 590–591. Such description is incorporated herein by reference. Each one of the digitized pixels 12 defines parameters, such as color and relative intensity, for one of a multiplicity of very small dot areas within the picture of frame 10. Accordingly, the video frame 10 may contain a relatively large number of the digitized pixels 12. For example, a frame containing 488 columns of pixels 12 by 488 rows of pixels 12 has a total of 238,144 pixels per frame.

Pixels 12 are typically transmitted or otherwise processed in a predetermined sequential order to preserve the spatial relationships between the pixels 12. For example, in a conventional raster scan application, pixels 12 may be transmitted to a memory for storage or from storage in memory to a video display in successive order beginning with a pixel 12a, that represents the pixel 12 in the first column of the first row of frame 10, and continuing in successive order to a pixel 12b, which represents the pixel 12 in the last column of the first row of frame 10. Immediately following the transmission of pixel 12b and sync information (not shown), a pixel 12c, which represents the pixel 12 in the first column of the second row, may be transmitted followed in successive order by the remaining pixels 12 contained in the second row of frame 10. Transmission of pixels 12 continues in this fashion until a pixel 12d, which represents the pixel 12 in the last column of the last row of frame 10, has been transmitted. Thus, any processing device which knows/ the timing relationship between an arbitrarily located pixel 12 and the beginning pixel 12a also knows or can easily calculate the spatial location of such arbitrarily located pixel 12 within frame 10.

A digital TV, VCR, or the like may contain a large frame or field memory which is capable of storing all of the pixels 12 within frame 10. Pixels 12 collectively appear as a serial data stream when they are applied to the frame memory. Except for special effects, the relative order of pixels 12 in this serial data stream must generally be preserved when they are read from the frame memory to preserve the spatial relationships between the pixels 12. Some special effects do not require this preserved order, and valuable computation time may be wasted by precisely preserving the order of pixels 12 as pixels 12 are being read from the frame memory.

One such special effect is a zoom effect wherein a small portion of a stored digitized is expanded and converted to an analog signal to fill an entire video display. For example, if frame 10 in FIG. 1 represents an entire video display, then an area within frame 10 bounded by rows i and j and columns m and n is expanded in a zoom special effect to fill the, entire frame 10. Thus, in the zoom special effect all of the digitized pixels 12 residing within frame 10 outside of the area bounded by rows i and j and columns m and n are inactive and may be discarded. In other words, these inactive ones of the pixels 12 need not be read from the frame memory. Consequently, the pixel 12 located at column m and row i will be utilized as the first active pixel 12a transmitted to the video display in the zoom special effect. Active pixels 12 may be duplicated to complete an entire row of frame 10; rows may be duplicated to complete the vertical component of the zoom effect. All of the digitized pixels transmitted to the video screen are converted to an analog signal for display on the video screen.

In a split screen special effect, an entire frame 10 may be shrunk into a small area of a screen, such as that bounded by row j and the last row of frame 10, and column n and the last column of frame 10. This special effect is accomplished by utilizing only active one of the pixels 12 out of each of a predetermined number of pixels 12 from an entire frame 10 of pixels 12, and ignoring the intervening inactive ones of the pixels 12 (ie. skipping inactive pixels). For the example depicted in FIG. 1, the shrunken frame is formed using only the active pixels 12, which reside in one of every three columns and one of every three rows of the frame 10.

The present invention provides a memory circuit which serves as a frame memory and permits these and other special effects to be performed efficiently. FIG. 2 shows a block diagram of a memory circuit 14 built according to the teachings of the present invention. In general, the preferred embodiment of memory circuit 14 represents a single chip integrated circuit that contains $2^{20}$ or 1,048,576 bits of memory storage organized as 262,144 four bit wide words with special write and read access arrangements. Accordingly, a sufficient quantity of word storage is provided to buffer or store an entire 488×488 frame of pixels 12 (see FIG. 1). If more than four bits of precision are required to accurately describe each pixel, then additional ones of memory circuit 14 may be used to store such additional bits.

Memory circuit 14 generally operates in a serial access mode for both write and read operations but has particular features which permit random access for writing or reading of the memory circuit 14 on a limited scale. Those skilled in the art will understand that serial access refers to a mode of storing and reading data in which the data must be read out from a memory in the same order sequential address in which it was stored into the memory. Furthermore, random access refers to the ability to write, read, or otherwise access any location in a memory array by supplying a selected unique address which corresponds to such memory location.

Specifically, for receiving analog video signals converted to digital pixels, memory circuit 14 includes a serial pixel data input 16a, which in the preferred embodiment supplies four bits data per pixel. Serial pixel data input 16a couples to an input port of a write serial latch 18a, and an output port of write serial latch 18a couples to an input port of a write register 20a. An output port of write register 20a couples to a data input port 22a of a memory array 24. In the preferred embodiment, memory array 24 is a dynamic random access memory (DRAM) array containing $2^{18}$ or 262,144 four bit memory locations. A data output port 22b of memory array 24 couples to a data input port of a read register 20b, and a data output port of read register 20b couples to a data input port of a read serial latch 18b. A data output port of read serial latch 18b couples to a serial pixel data output 16b, which in the preferred embodiment provides four bits of data per pixel for conversion to an analog video signal for display.

A serial write clock terminal 26a couples to a write address generator 28a, an arbitration and control circuit 30, and a clock input of write serial latch 18a. Similarly, a serial read clock terminal 26b couples to a read address generator 28b, arbitration and control circuit 30, and a clock input of read serial latch 18b. A refresh address and timing circuit 32 has an output which couples to an input of arbitration and control circuit 30, and outputs from arbitration and control circuit 30 couple to a clock input of write register 20a, a clock input of read register 20b, a control input of memory array 24, and an address input of memory array 24.

As shown in FIG. 2, address generators 28a and 28b are structurally similar to one another in the preferred embodiment. Thus, a write control data terminal 34a couples to a serial data input of an address buffer register 36a in write address generator 28a. A read control data terminal 34b couples to a serial data input of an address buffer register 36b in read address generator 28b. Likewise, a write control strobe terminal 38a couples to a clock input of address buffer register 36a, and a read control strobe terminal 38b couples to a clock input of address buffer register 36b. A data output of address buffer register 36a couples to a data input of an address sequencer 40a, and a data output of address buffer register 36b couples to a data input of an address sequencer 40b. A write reset terminal 42a couples to a clear input of address sequencer 40a, and a write transfer terminal 44a couples to a preset input of address sequencer 40a. A read reset terminal 42b couples to a clear input of address sequencer 40b, and a read transfer terminal 44b couples to a preset input of address sequencer 40b. Serial write clock terminal 26a couples to a clock input of address sequencer 40a within address generator 28a, and terminal 26b couples to a clock input of address sequencer 40b within address generator 28b. An output 46a of address sequencer 40a presents the output signal from address generator 28a and couples to an input of arbitration and control circuit 30. Likewise, an output 46b of address sequencer 40b presents the output signal from address generator 20b and couples to arbitration and control circuit 30. Memory circuit 14 may be provided in a 20 pin integrated circuit package.

As discussed above, memory circuit 14 may be operated in either a serial or a limited random access mode. In addition, the storing, or writing, of data into memory circuit 14 may occur asynchronously with the reading or providing of data from memory circuit 14. Asynchronous meaning timed by a clock other than a common clock. Memory circuit 14 may be written into serially by activating write reset signal on terminal 42a to clear address sequencer 40a. Then, a four bit wide stream of serial data may be stored in memory circuit 14 by applying the four bit data nibbles at the write clock rate to the data input 16a while asserting a serial write clock signal at terminal 26a. One assertion of the serial write clock signal causes write serial latch 18a to temporarily store or buffer one four bit data nibble. Write serial latch 18a operates as a four bit wide shift register. Thus, subsequent four bit nibbles from the data stream of serial pixel data applied at data input 16a are shifted into serial latch 18a at the write clock rate upon subsequent assertions of the serial write clock signal.

In addition, each assertion of the serial write clock signal also causes address sequencer 40a of write address generator 28a to supply a new selected access address to arbitration and control circuit 30. In other words, address sequencer 40a provides a stream of addresses to arbitration and control circuit 30 which corresponds to the stream of data being stored in write serial latch 18a.

Arbitration and control circuit 30 receives addresses from address generators 28a-28b and refresh address and timing circuit 32. Sometimes the arbitration and control circuit 30 receives multiple addresses simultaneously. Circuit 30 monitors these inputs and various timing signals to decide which of the addresses provided on these inputs should be transferred at a specific time to memory array 24. Arbitration and control circuit 30 includes conventional logic circuits for controlling the timing operation of the dynamic memories which comprise memory array 24, as described by M. Hashimoto et al, in the Proceedings of IEEE Custom Integrated Circuits Conference, May 4-7, 1987, pages 315-318. Such description is incorporated herein by reference. Thus, arbitration and control circuit 30 passes an address generated by address generator 28a on to memory array 24 so that data may be written into memory array 24, but a delay may occur due to refresh operations or read accesses of memory array 24. Accordingly, arbitration and control circuit 30 may additionally contain storage devices so that addresses generated by address generators 28a-28b are not lost when immediate access to memory array 24 is blocked. When arbitration and control circuit 30 identifies a time at which the serial pixel data may be written into memory array 24, such data is transferred from write serial latch 18a into write register 20a and then written into memory array 24. Accordingly, write serial latch 18a and write register 20a together represent a double buffering scheme which permits asynchronous storing of serial pixel data into memory circuit 14.

The reading of data from memory array 24 occurs in a manner similar to that described above for the storing of data into memory array 24. Thus, an address generated by address generator 28b is transferred through arbitration and control circuit 30 at an appropriate time to cause data from memory array 24 to be read into read register 20b. Thereafter, this data is transferred into read serial latch 18b so that such data may be provided at data output terminal 16b through the application of a serial read clock signal at terminal 26b. The read clock signal can be at the same rate as the write clock signal or at a different rate. Serial data is provided asynchronous at output 16b from the memory array 24 and to memory circuit 14 from the terminal 16a.

The limited random access feature of memory circuit 14 is provided through address generators 28a-28b. In the embodiment of memory circuit 14 shown in FIG. 2, write address generator 28a and read address generator 28b are structurally and operationally identical, except that write address generator 28a provides write addresses while read address generator 28b provides read addressed and their clock rates may be different Accordingly, both address generators 28a-28b are described below by reference only to write address generator 28a. Those skilled in the art will recognize that read address generator 28b operates identically in the preferred embodiment.

A random access address may be serially loaded into address buffer register 36a by applying such address to control data terminal 34a in a sequential manner and activating a control strobe signal applied at terminal 38a when valid data appear at terminal 34a. Thus, in the embodiment shown in FIG. 2, address buffer register 36a represents a serial shift register. The use of a serial shift register conserves the number of external pins needed for constructing memory circuit 14 in an integrated circuit when compared to a parallel loaded register. After the random access address has been entered into address buffer register 36a, it may be transferred to address sequencer 40a by the application of a write transfer signal at terminal 44a and their clock rates may be different. In the preferred embodiments of the present invention, address sequencer 40a may represent a presentable, binary counter or other presettable sequencing circuit. Thus, the transferred address initiates a serial sequence of addresses which are subsequently generated in the regular manner by address generator 28a. If address sequencer 40a represents a binary counter, then subsequent addresses will increment or decrement starting with this preset value.

If memory array 24 contains $2^{18}$ four bit words of memory, then address buffer register 36a may advantageously represent an 18 bit register, and address sequencer 40a may represent an 18 bit counter, or other sequencing circuit. On the other hand, address buffer register 36a and address sequencer 40a may contain fewer bits, such as nine bits for example. In the nine bit situation, the random access address provided by address buffer register 36a could access the beginning of memory pages or rows wherein each page or row contains $2^9$ or 512 words of memory.

The inclusion of address buffer register 36a to provide a limited random access feature permits memory circuit 14 to be efficiently utilized in a zoom special effect. For example, a zoom effect may be accomplished by writing an entire frame of pixel data into memory array 24 using a serial write access mode. A beginning pixel address, or selected start location for a read operation, such as the address of a pixel located at row i column m in FIG. 1, may then be loaded into read address buffer register 36b and transferred to address sequencer 40b. A first row, such as row i, of the portion of frame 10 which is to be expanded into an entire frame may then be read from memory array 24 in a serial or sequential mode until a pixel corresponding to, for example, row i, column n appears at output terminal 16b. Readout is accomplished at the read clock rate which may be a different rate than the write clock rate. A row may be repeated as often as necessary to achieve vertical zoom by transferring the random access address from address buffer register 36b to address sequencer 40b. An address corresponding to the pixel located at row i+1 and column m may then be loaded into address buffer register 36b and transferred to address sequencer 40b. This process continues at the read clock rate until a final pixel for the frame to be expanded has been output from memory array 24. The pixels are converted from digital signals to analog video signals for display. By operating the read clock at a slower rate than the write clock rate, the system can expand the duration required for reading out a portion of the stored data both horizontally and vertically to fill all or part of the video display screen. Due to this feature, a video system need not start accesses of memory circuit 12 at an initial address, such as pixel 12a (shown in FIG. 1) and access inactive pixels stored within memory array 24. More efficient operation results.

The present invention contemplates alternate embodiments of address generators 28a-28b. A first alternate embodiment of address generators 28a-28b is shown in FIG. 3. FIG. 3 shows only one of address generators 28. The address generator 28 shown in FIG. 3 may serve as either write address generator 28a or read address generator 28b (see FIG. 2).

In this first alternate embodiment of an address generator 28, address buffer register 36 may be loaded both serially and in parallel. Thus, control data terminal 34, which may represent either write control data terminal 34a or read control data terminal 34b, as discussed above in connection with FIG. 2, couples to the serial data input of address buffer register 36. Control strobe terminal 38 couples to the serial clock input of address buffer register 36 and a serial clock input of an address offset register 48. The parallel data output of address buffer register 36 couples to a first input of an adder 50 and the data input of address sequencer 40. A parallel data output of address offset register 48 couples to a second input of adder 50. An output of adder 50 couples to a parallel data input of address buffer register 36, and transfer terminal 44 couples to a parallel clock input of address buffer 36 and the preset input of address sequencer 40. A most significant bit from the parallel data output or a serial output bit, of address buffer register 36 couples to a serial data input of address offset register 48. Serial clock terminal 26 couples to the clock input of address sequencer 40, and reset terminal 42 couples to a clear input of address sequencer 40. A data output of address sequencer 40 couples to address generator output 46.

Address buffer register 36 and address sequencer 40 operate in this first alternate embodiment similarly to their above-described operation in connection with address generator 28a-28b of FIG. 2. However, in this first alternate embodiment, the control data provided at terminal 34 is used to load both address buffer register 6 and address offset register 48. Thus, additional bits of control data are loaded into memory circuit 14 without requiring additional integrated circuit pins. Moreover, a most significant bit, or a serial output bit 51, from address offset register 48 may advantageously be routed to the control data input for the other one of read and write address generators 28a and 28b (see FIG. 1). In addition, the control strobe signal applied at terminal 38 may be routed to the other one of control strobe terminals 38a and 38b of FIG. 2. These two connections between address generators 28a and 28b eliminate two integrated circuit pins from the structure shown in FIG. 2.

In this first alternate embodiment of the present invention, the control data contained in address offset register 48 is added to a current initial address value contained in address buffer register 36 to provide a new initializing random access address value. This new initializing value is loaded into address buffer register 36 when the current address value is transferred into address sequencer 40.

Referring additionally to FIG. 1, the first alternate embodiment of the present invention may be advantageous in performing, for example, the zoom special effect. Thus, the address offset value loaded into address offset register 48 may represent the quantity of inactive pixels occurring between column n of one row and column m of the next row. At the end of each frame row a transfer signal may be asserted on terminal 44, and the random access address of the next active pixel, corresponding to column n of the next row, is automatically calculated and stored in address buffer register 36 to initiate another sequence of sequential accesses to memory circuit 16. Complexity of a video system employing memory circuit 14 decreases because components external to memory circuit 14 need not calculate this address.

A second alternate embodiment of address generators 28a-28b from FIG. 2 is shown in FIG. 4. The FIG. 4 embodiment illustrates that random access addresses may be loaded into address buffer register 36 in a parallel fashion, which may be more compatible with conventional microprocessor integrated circuits. However, the number of integrated circuit pins needed to implement this embodiment increases over the embodiments discussed above in connection with FIGS. 2 and 3. In addition, FIG. 4 shows the inclusion of an alternate address buffer register 52 in addition to address buffer register 36. Specifically, control data terminals 34 may advantageously provide an eight bit microprocessor data bus which couples to data inputs of individual eight bit portions 54a, 54b, and 54c of address buffer register 36. In addition, control data terminals 34 couple to data inputs of individual eight bit portions 56a, 56b, and 56c of alternate address buffer register 52. Data outputs of individual portions 54a-54c together form a 24 bit bus which couples to a first data input of a multiplexer 58. Likewise, data outputs of individual portions 56a-56c form a 24 bit bus which couples to a second data input of multiplexer 58. A data output of multiplexer 58 couples to a data input of a binary counter which serves as address sequencer 40 in this second alternate embodiment. Of course, those skilled in the art will recognize that the number of subregisters included within address buffer register 36 and alternate address buffer register 52 and the number of bits contained within the buses described above are subject to a substantial variation in accordance with specific application requirements.

In addition, microprocessor address input terminals 60a, 60b, and 60c, couple to address inputs of a decoder 62 and an address input terminal 60d couples to an enable input of decoder 62. The control strobe terminal 8, discussed above, couples to an enable input of decoder 62. Outputs 01-06 of decoder 62 couple to clock inputs of individual address buffer register portions 54a-54c and clock inputs of individual alternate address buffer register portions 56a-56c, respectively. An output 07 from decoder 62 couples to a clock input of a flip flop 64 which is configured to toggle upon the activation of the clock input. An output of flip flop 64 couples to a select input of multiplexer 58. An output 08 of decoder 62 couples to a preset input of binary counter 40. The serial clock 26 couples to a clock input of binary counter 40, and reset terminal 42 couples to a clear input of flip flop 64 and a clear input of binary counter 40. An output of binary counter 40 couples to output 46 of address generator 28.

In this second alternate embodiment of address generator 28, one initializing random access address may be stored in address register 36 while an alternate initializing random access address is stored in alternate address buffer register 52. A microprocessor (not shown) may store these addresses in memory circuit 14 through conventional memory or I/O write operations to addresses specified by signals applied on terminals 60a-60c. An address input bit applied at terminal 60d may advantageously distinguish between a write address generator 28a and a read address generator 28b (see FIG. 1). By applying an active signal to reset terminal 42, flip flop 64 and binary counter 40 may be initialized to a cleared state. At this point, address generator 28 operates substantially as described above in connection with FIG. 2. However, an alternate random access address stored in alternate address buffer 52 may selectively preset binary counter 40. A microprocessor write operation which toggles flip flop 54, followed by a microprocessor write operation that transfers data into binary counter 40, presets binary counter 40 with an alternate random access address. Flip flop 64 may be toggled by performing a write operation to the address which activates output 07 of decoder 62. A transfer operation from the selected one of address buffer registers 36 and 52 occurs by writing to the address which activates the output 08 of decoder 62.

Alternate address buffer register 52 may advantageously be used by a video system to efficiently buffer a line within a frame of data. Since memory circuit 14 of the preferred embodiment contains a sufficient quantity of memory to accommodate $2^{18}$ or 262,144 pixels, memory circuit 14 has unused memory locations when used to store a single frame of data which contains, for example, 480 pixel columns by 480 pixel rows. Accordingly, a random access address in this unused portion of memory may be loaded in alternate address buffer register 52. A single line of a frame may be efficiently stored in memory circuit 14 by transferring this alternate address value to binary counter 40, then sequentially storing such line of pixels into the otherwise unused portion of memory circuit 14.

In addition, the present invention contemplates alternative embodiments for address sequencer 40. As shown in FIG. 4, address sequencer 40 may represent a conventional presetable, clearable, binary counter. Such circuits are well known to those skilled in the art and need not be described in detail herein. However, address sequencer 40 may alternatively represent a circuit which increments or decrements by a variable step value which may differ from the value of one. Such a circuit is shown in FIG. 5.

Accordingly, in FIG. 5 the address sequencer data input couples to a first input of a multiplexer 66, the address sequencer's preset terminal couples to a select input of multiplexer 66. An output of multiplexer 66 couples to a data input of a register 68, and the clock input of address sequencer 40 couples to a clock input of register 68. Likewise, the reset terminal 42 couples to a clear input of register 68. A data output of register 68 provides the data output of address sequencer 40 and additionally couples to a first input of an adder 70. An output of adder 70 couples to a second input of multiplexer 66. The control data terminals 34, discussed above in connection with FIGS. 2-4, couple to a data input of a register 72. Additionally, the control strobe terminal 38, discussed above in connection with FIGS. 2-4, couples to a clock input of register 72. A data output of register 72 couples to a second input of adder 70.

In this FIG. 5 embodiment of address sequencer 40, register 72 may represent either a parallel or a serially loaded register, as discussed above in connection with FIGS. 2-4. Additionally, if register 72 represents a serially loaded register, then register 72 may represent one register out of many coupled together in a long chain of serially loaded registers, as discussed above in connection with FIG. 3. The data loaded into register 72 is intended to represent a increment step by which address sequencer 40 generates successive addresses at output 46 of address generator 28. A current output of address sequencer 40 is added to this step increment value in adder 70, and routed through multiplexer 66 back to register 68. Thus, a subsequent address generated by address sequencer 40 equals the previous address plus the address step increment contained in register 72. This address step increment need not equal the value of one but may equal any positive or negative value. Furthermore, if the number of bits contained in the buses which couple register 72, adder 70, multiplexer 66, and register 68 together is greater than the number of bits provided at the output of address sequencer 40, then subsequent addresses may be incremented in fractional steps.

Address sequencer 40 may be preset, or initialized, with a random access address by applying an active signal on the preset terminal, supplying data at the data input terminals, and clocking the clock signal of address sequencer 40. Thus, this initializing random access value is loaded directly into register 68. In addition, address sequencer 40 may be cleared, or reset, by applying a reset signal to the clear input terminal.

Referring additionally to FIG. 1, the address sequencer 40 depicted in FIG. 5 is useful in performing the split screen special effect where an entire frame is displayed in only a small portion of a video screen, such as the lower right hand portion shown in FIG. 1. With this special effect, if memory circuit 14 has every pixel 12 of a frame 10 stored therein, then only one out of every group of a predetermined number of stored pixels is active in constructing the shrunken screen. Address sequencer 40 shown in FIG. 5 allows memory circuit 14 to provide only the active pixels by supplying a sequence of addresses which omits inactive pixel addresses.

In summary, the present invention provides a memory circuit which allows a video system to efficiently perform special effects. Specifically, the inclusion of various limited random accessing features allows memory circuit 14 to store and/or provide only active pixels for a given special effect and not inactive pixels. Consequently, active pixels may be retrieved from memory circuit 14 much quicker than occurs with the use of prior art frame memory circuits.

The foregoing description uses preferred embodiments to illustrate the present invention. However, those skilled in the art will recognize that changes and modifications may be made in these embodiments without departing from the scope of the present invention. For example, read address generator 28b need not precisely resemble write address generator 28a. Additionally, although the embodiments depicted in FIGS. 3-5 are mentioned above as being alternative embodiments, nothing prevents one skilled in the art from combining the teachings from more than one of these alternate embodiments into a single frame memory circuit 14. Moreover, those skilled in the art will recognize that additional address processing capabilities may be built into frame memory circuit 14. Such additional address processing capabilities may include the addition of a signal which indicates the end of a frame line, a signal which indicates the end of a frame, and the automatic transferring of random access addresses to an address sequencer upon the occurrence of the end of line and end of frame signals. Furthermore, although specific frame and memory array dimensions have been presented herein to aid in teaching the present invention, it is intended that the present invention not be limited to any particular dimensions. These and other modifications obvious to those skilled in the art are intended to be included within the scope of the present invention.

What is claimed is:

1. A memory circuit for storing and reading out streams of data, the memory circuit accommodating both serial access and selected access, and the memory circuit comprising:
    a random access memory array having an address input and a data input port;
    a data buffer having a data output port coupled to the memory array data input port, the data buffer being arranged for asynchronously applying the streams of data to the memory array;
    an address sequencer including a first register having a data input coupled to a node which serves as the address sequencer data, said address sequencer output coupled to the memory array address input, the address sequencer generating a sequence of memory addresses to be successively applied to the memory array;
    a second register having an output, the second register being arranged for storing an increment step value; and
    an adder having a first input coupled to the first register output, a second input coupled to the second register output, and an output coupled to the first register data input; and
    an address buffer register having an output coupled to the address sequencer data input, the address buffer register supplying a selected address to the address sequencer data input to initialize the sequence of memory addresses generated by the address sequencer.

2. A memory circuit, in accordance with claim 1, wherein
    the second register being arranged for storing an increment step value equal to one.

3. A memory circuit, in accordance with claim 1, wherein
    the greater register being arranged for storing an increment step greater than one.

4. A memory circuit for storing an reading out streams of data, said memory circuit accommodating both serial access and selected access, and the memory circuit comprising:
    a random access memory array having an address input and a data port;
    a data buffer having a data port coupled to the memory array data port, the data buffer being arranged for asynchronously applying the steams of data to the memory array;
    an address sequencer having a data input and having an output coupled to the memory array address input, the address sequencer generating a sequence of memory addresses to be successively applied to the memory array;
    an address buffer register having an output coupled to the address sequencer data input the address buffer register supplying a selected address to the address sequencer data input to initialize the sequence of memory addresses generated by the address sequencer;
    an address offset register for storing address offset data and having an output and
    an adder having a first input coupled to the address buffer register output, a second input coupled to the address offset register output, and an output coupled to a data input of the address buffer register, the adder providing the selected address representing a sum of a previous address and the address offset data.

5. A memory circuit, in accordance with claim 4, wherein
    the address offset register is arranged for storing address offset data having a value equal to one.

6. A memory circuit, in accordance with claim 4, wherein
    the address offset register is arranged for storing offset data having a value greater than one.

7. A memory circuit, in accordance with claim 4 wherein
    the address offset register is arranged for storing a variable value of offset data.

8. An integrated memory circuit for storing an reading out streams of data, the integrated memory circuit accommodating serial access and selected access, and the integrated memory circuit comprising:
    a random access memory array having an address input, a data input port, and a data output port;
    a first data buffer having a data output port coupled to the memory array data input port, the first data buffer asynchronously writing the stream of data into the memory array;
    a second data buffer having a data input port coupled to the memory, array data output port, the second data buffer asynchronously reading out the stream of data from the memory array; and first and second address generators wherein the first address generator generates addresses used for writing the data stream into the memory array, the second address generator generates addresses used for reading the data stream from the memory array, and each of the first and second address generators additionally comprises:

a binary counter having an output coupled to the memory array address input and a data input, the binary counter being arranged for counting memory addresses to be applied to the memory array;

a serially loaded address buffer register having an output coupled to the binary counter data input, the address buffer register being arranged for supplying an initial memory address to start the count of the binary counter;

an address offset register having an output, the address offset register storing address offset data; and an adder having a first input coupled to the address buffer register output, a second input coupled to the address offset register output, and an output coupled to a data input of the address buffer register, the adder providing a sum of a previous address and the address offset data to the address buffer register.

* * * * *